(12) United States Patent
Kim et al.

(10) Patent No.: US 9,774,009 B2
(45) Date of Patent: Sep. 26, 2017

(54) DISPLAY DEVICE

(71) Applicant: SAMSUNG DISPLAY CO., LTD., Yongin-si, Gyeonggi-Do (KR)

(72) Inventors: Byoung Ki Kim, Seoul (KR); Il Hun Seo, Asan-si (KR); Ho Jin Yoon, Hwaseong-si (KR); Dae Woo Lee, Hwaseong-si (KR); Yun-Mo Chung, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/856,587

(22) Filed: Sep. 17, 2015

(65) Prior Publication Data
US 2016/0260931 A1 Sep. 8, 2016

(30) Foreign Application Priority Data
Mar. 3, 2015 (KR) .................. 10-2015-0029796

(51) Int. Cl.
*H01L 51/52* (2006.01)
*H01L 27/32* (2006.01)
*G02B 5/08* (2006.01)

(52) U.S. Cl.
CPC ...... *H01L 51/5271* (2013.01); *H01L 27/3211* (2013.01); *H01L 27/3293* (2013.01); *H01L 51/5246* (2013.01); *G02B 5/0808* (2013.01); *H01L 27/3244* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 2003/0147027 A1* | 8/2003 | Wachi | G02F 1/133514 349/106 |
| 2009/0058293 A1* | 3/2009 | Maeda | H01L 51/5253 313/512 |
| 2011/0063561 A1* | 3/2011 | Song | G02F 1/1339 349/153 |
| 2011/0242468 A1* | 10/2011 | Choi | C08G 8/12 349/129 |
| 2014/0138643 A1* | 5/2014 | Choi | H01L 27/3267 257/40 |
| 2014/0291637 A1 | 10/2014 | Yim et al. | |

FOREIGN PATENT DOCUMENTS

| | | |
|---|---|---|
| JP | 2013-172802 A | 9/2013 |
| KR | 10-2009-0102113 A | 9/2009 |
| KR | 10-2010-0090448 A | 8/2010 |
| KR | 10-2014-0003097 A | 1/2014 |
| KR | 10-2014-0073216 A | 6/2014 |

* cited by examiner

*Primary Examiner* — Michelle Mandala
(74) *Attorney, Agent, or Firm* — Lee & Morse, P.C.

(57) ABSTRACT

A display device, including a first substrate and a second substrate facing each other and integrally attached to each other by a sealant; a display unit on one surface of the first substrate facing the second substrate; a reflective film on one surface of the second substrate facing the first substrate, the reflective film including a first region inside the sealant, a second region overlapping the sealant, and a third region outside the sealant; and a passivation layer covering at least the third region of the reflective film.

10 Claims, 8 Drawing Sheets

DISPLAY DEVICE

CROSS-REFERENCE TO RELATED APPLICATION

Korean Patent Application No. 10-2015-0029796, filed on Mar. 3, 2015, in the Korean Intellectual Property Office, and entitled: "Display Device," is incorporated by reference herein in its entirety.

BACKGROUND

Field

The described technology relates to a display device.

SUMMARY

Embodiments may be realized by providing a display device, including a first substrate and a second substrate facing each other and integrally attached to each other by a sealant; a display unit on one surface of the first substrate facing the second substrate; a reflective film on one surface of the second substrate facing the first substrate, the reflective film including a first region inside the sealant, a second region overlapping the sealant, and a third region outside the sealant; and a passivation layer covering at least the third region of the reflective film.

The display unit may include an emission area and a non-emission area, and the first region of the reflective film may include an opening corresponding to the emission area.

The emission area may include at least one subpixel.

The third region of the reflective film may be spaced apart from an edge of the second substrate, and the passivation layer may contact the edge of the second substrate.

The passivation layer may cover a part of an edge of the first region facing the sealant, an entirety of the second region, and an entirety of the third region of the reflective film.

The reflective film may include a metal, and the passivation layer may include one or more of silicon nitride, silicon oxide, or polyimide.

Embodiments may be realized by providing a display device, including at least two display panels including sides that contact each other, each of the at least two display panels including a first substrate and a second substrate facing each other and integrally attached to each other by a sealant; a display unit on one surface of the first substrate facing the second substrate; a reflective film on one surface of the second substrate facing the first substrate, the reflective film including a first region inside the sealant, a second region overlapping the sealant, and a third region outside the sealant; and a passivation layer covering at least the third region of the reflective film.

The display unit may include an emission area and a non-emission area, and the first region of the reflective film may include an opening corresponding to the emission area.

The emission area may include at least one subpixel.

The third region of the reflective film may be spaced apart from an edge of the second substrate, and the passivation layer may contact the edge of the second substrate.

The passivation layer may cover a part of an edge of the first region facing the sealant, an entirety of the second region, and an entirety of the third region of the reflective film.

The reflective film may include a metal, and the passivation layer may include one or more of silicon nitride, silicon oxide, or polyimide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
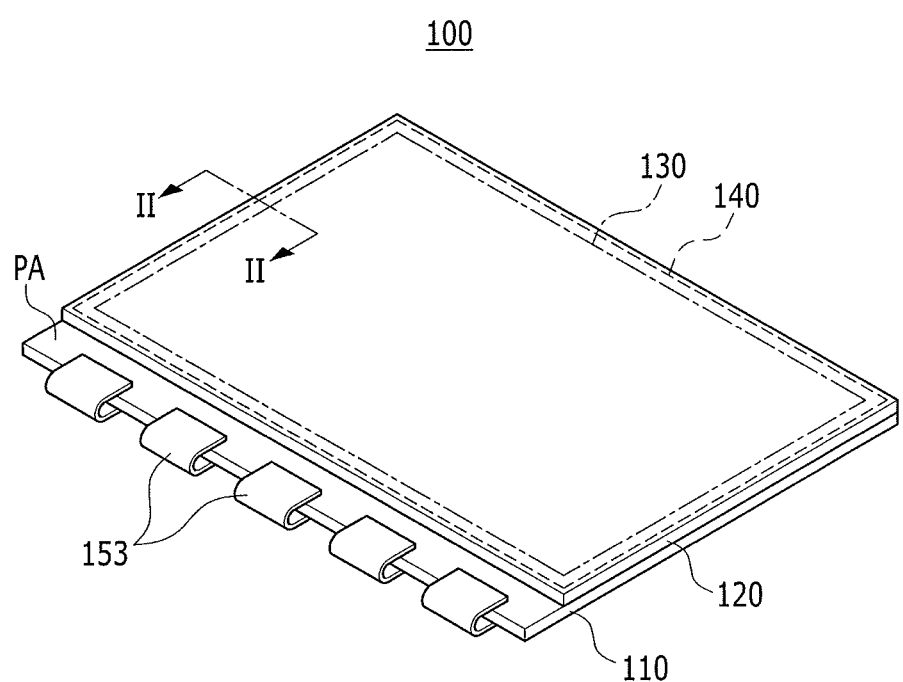
FIG. 1 illustrates a perspective view of a display device according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

In addition, unless explicitly described to the contrary, the word "comprise" and variations such as "comprises" or "comprising", will be understood to imply the inclusion of stated elements but not the exclusion of any other elements. In addition, the size and thickness of each configuration shown in the drawings are arbitrarily shown for understanding and ease of description, but the present disclosure is not limited thereto.

FIG. 1 illustrates a perspective view of a display device according to a first exemplary embodiment, and FIG. illustrates is a partial cross-sectional view of the display device of FIG. 1 taken along line II-II.

Figure 2:
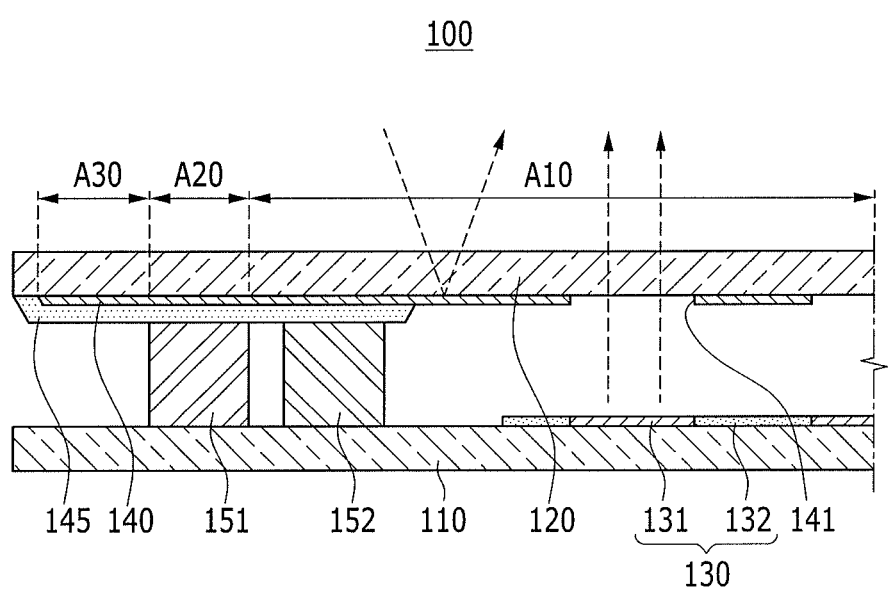
FIG. 2 illustrates a partial cross-sectional view of the display device of FIG. 1 taken along line II-II.

Referring to FIGS. 1 and 2, a display device 100 according to the first exemplary embodiment may include a first substrate 110 and a second substrate 120 disposed to face each other, a display unit 130 formed on an inner surface of the first substrate 110, and a reflective film 140 formed on an inner surface of the second substrate 120. The display device 100 may perform a predetermined display by using the display unit 130 (display mode), and implement a mirror function by using the reflective film 140 (mirror mode).

The first substrate 110 may be made of, for example, glass, plastic or metal, and the second substrate 120 may be made of, for example, transparent glass or transparent plastic. The first substrate 110 and the second substrate 120 may be integrally attached to each other by a sealant 151. The sealant 151 may be formed along edges of the two substrates 110 and 120 between the first substrate 110 and the second substrate 120 to seal a space between the two substrates 110 and 120. The sealant 151 may be formed of, for example, an ultraviolet curable resin.

A getter 152 for absorbing moisture or residual gas may be formed inside of the sealant 151. The getter 152 may be positioned between the display unit 130 and the sealant 151 and may contact the sealant 151 or be spaced apart from the sealant 151 at a predetermined interval. A moisture absorbent or a filler, for example, may be provided in the space surrounded by the first substrate 110, the second substrate 120, and the getter 152. The getter 152 may be omitted.

The first substrate 110 may include a pad part PA, which may not overlap with the second substrate 120. In the pad part PA, pad electrodes connected with wires in the display unit 130 may be positioned. A driving module 153 such as a chip on film or a flexible printed circuit may be attached to the pad part PA to supply the display unit 130 with various kinds of signals required for displaying.

The display unit 130 may be formed on one surface of the first substrate 110 facing the second substrate 120 and may include a plurality of emission areas 131. Non-emission areas 132 may be disposed between the plurality of emission areas 131. The reflective film 140 may be formed on one surface of the second substrate 120 facing the first substrate 110 and may face the non-emission area 132. For example, a plurality of openings 141 corresponding to, e.g., overlapping, the plurality of emission areas 131 may be formed in the reflective film 140.

The reflective film 140 may be made of a material reflecting light incident from the outside and may include metal. For example, the reflective film 140 may include aluminum (Al), chromium (Cr), silver (Ag), iron (Fe), platinum (Pt), nickel (Ni), or molybdenum (Mo).

Figure 3:
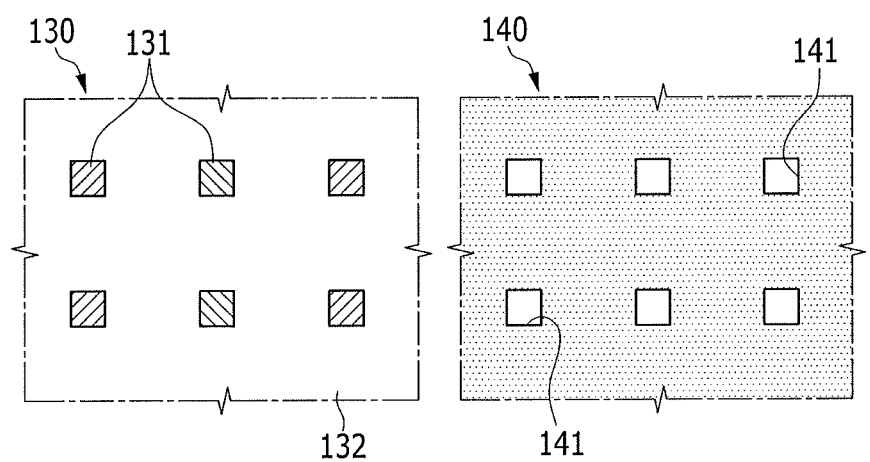
FIG. 3 illustrates a partial plan view of a display unit and a reflective film in the display device illustrated in FIG. 2.

FIG. 3 illustrates a partial plan view of a display unit and a reflective film in the display device illustrated in FIG. 2.

Referring to FIGS. 2 and 3, the display unit 130 may include the plurality of emission areas 131 positioned at a distance from each other. Each of the plurality of emission areas 131 may correspond to one subpixel or one pixel. The subpixel may be one of a red subpixel, a green subpixel, and a blue subpixel, and three subpixels may be collected to configure one pixel. The pixel may further include a white subpixel.

The display device 100 may be configured by all kinds of display devices such as an organic light emitting diode display, a liquid crystal display, or an electrophoretic display. In the case of the organic light emitting diode display, each subpixel may include a driving circuit, and an organic light emitting diode, in which emission may be controlled by the driving circuit. A detailed structure of the emission area 131 will be described below.

The plurality of openings 141 corresponding to the plurality of emission areas 131 may be formed in the reflective film 140. In the display mode, each of the plurality of emission areas 131 may emit light with predetermined intensity, and the light emitted from the emission area 131 may be emitted to the outside by passing through the openings 141 of the reflective film 140 and the second substrate 120. The display device 100 may display a full-color image in the display mode.

Under a condition in which the display unit 130 is not operated and external light exists, the display device 100 may reflect the external light by the reflective film 140 to function as a mirror (mirror mode). The reflective film 140 may reflect the external light even in the display mode, but the intensity of the light emitted from the display unit 130 may be higher than the intensity of the reflected external light, and deterioration in image quality, for example, due to the reflected light, may be very low.

In the display device 100, the reflective film 140 providing the mirror function may overlap with the sealant 151 and may be extended to the outside of the sealant 151. The reflective film 140 may include a first area A10 positioned inside of, e.g., interior to in a peripheral direction, the sealant 151, a second region A20 overlapping with the sealant 151, and a third region A30 positioned outside of, e.g., exterior to in a peripheral direction, the sealant 151.

Since the reflective film 140 may include the second region A20 and the third region A30, in the display device 100, most of the second substrate 120 may be used as a mirror by extending a mirror surface up to the outside of the sealant 151. In a display device, the reflective film may be formed inside of the sealant, and the mirror surface expressed in the mirror mode may be limited to the inside of the sealant. However, in the display device 100 of the first exemplary embodiment, the reflective film 140 may be extended, and most of the second substrate 120 may be used as the mirror up to the outside of the sealant 151.

The display device 100 of the first exemplary embodiment may include a passivation layer 145 covering at least the third region A30 of the reflective film 140. Since the reflective film 140 may include a metal, when the third region A30 of the reflective film 140 is exposed to external air outside the display device 100, moisture and oxygen included in the external air may flow into the display device 100 through the reflective film 140. Since an organic emission layer included in the organic light emitting diode may be vulnerable to moisture and oxygen, when the organic emission layer is exposed to moisture and oxygen, the organic emission layer may easily deteriorate, and display quality may deteriorate.

The passivation layer 145 may cover at least the third region A30 of the reflective film 140 to prevent the reflective film 140 from being exposed to external air outside the display device 100. The third region A30 may be spaced apart from the edge of the second substrate 120 at a predetermined interval, and the passivation layer 145 may contact the edge of the second substrate 120 to cover the edge of the third region A30 with a sufficient thickness. The passivation layer 145 may cover the entire third region A30 to prevent the third region A30 from being exposed to the external air.

The passivation layer 145 may cover the third region A30 of the reflective film 140 outside of the sealant 151 or may cover a part of the first region A10, the entire second region A20, and the entire third region A30. In FIG. 1, a second case is illustrated as an example. In the second case, the single passivation layer 145 may be formed with a predetermined width from the inside of the getter 152 to the edge of the second substrate 120. The reflective film 140 may not contact the getter 152 and the sealant 151.

The passivation layer 145 may be formed of a material that may prevent moisture from permeating. For example, the passivation layer 145 may include one or more of an inorganic material, such as silicon nitride ($SiN_x$) or silicon oxide ($SiO_2$), or a polyimide-based organic material.

Even though the reflective film 140 may be extended up to the outside of the sealant 151, the reflective film 140 may be covered by the passivation layer 145, and may not contact external air, and the reflective film 140 may not function as a passage transferring moisture and oxygen into the display device 100. Accordingly, in the display device 100 of the first exemplary embodiment, the reflective film 140 may be extended to enhance quality of the mirror surface and suppress deterioration in the display unit 130 in the mirror mode, and reliability of products may be enhanced.

Figure 4:
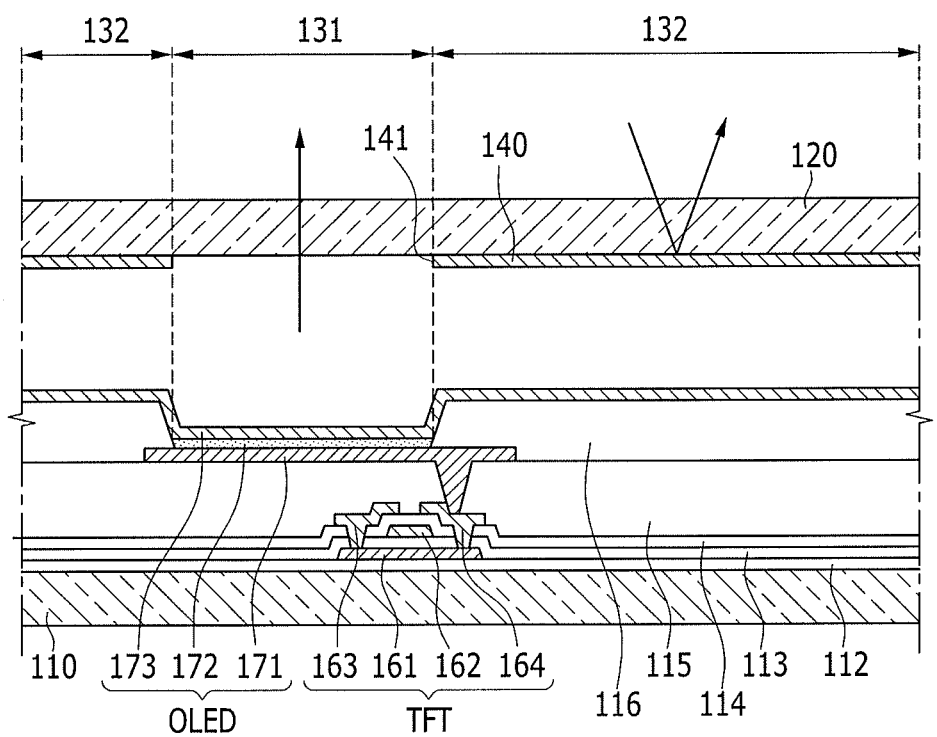
FIG. 4 illustrates a partially enlarged view of the display device illustrated in FIG. 2.

FIG. 4 illustrates a partially enlarged view of the display device illustrated in FIG. 2 and illustrates a case in which the display device may be an organic light emitting diode display.

Referring to FIG. 4, the display unit 130 may include the emission area 131 and the non-emission area 132, and one subpixel may be positioned for every emission area 131. The subpixel may include a driving circuit including a switching thin film transistor, a driving thin film transistor, and a storage capacitor, and an organic light emitting diode OLED connected to the driving thin film transistor.

In FIG. 4, for convenience, one driving thin film transistor TFT is illustrated, but the driving circuit may further include an additional thin film transistor and an additional capacitor. The display unit 130 further may include wires such as a scan line transferring a scan signal, a data line transferring a data signal, and a driving voltage line transferring a driving voltage.

A buffer layer 112 may be formed on the first substrate 110. The buffer layer 112 may be formed by a single layer of silicon nitride ($SiN_x$) or a double layer of silicon nitride ($SiN_x$) and silicon oxide ($SiO_2$). The buffer layer 112 may prevent impurities from permeating through the substrate 110 and planarize the surface.

A semiconductor layer 161 may be formed on the buffer layer 112. The semiconductor layer 161 may be formed of polysilicon or an oxide semiconductor, and the semiconductor layer 161 formed of the oxide semiconductor may be covered by a separate passivation layer. The semiconductor layer 161 may include a channel region, in which impurities may not be doped, and a source region and a drain region, in which the impurities may be doped.

A gate insulating layer 113 may be formed on the semiconductor layer 161. The gate insulating layer 113 may be formed of a single layer of silicon nitride ($SiN_x$) or silicon oxide ($SiO_2$) or a laminated layer of silicon nitride ($SiN_x$) and silicon oxide ($SiO_2$). A gate electrode 162 may be formed on the gate insulating layer 113. The gate electrode 162 may overlap with the channel region of the semiconductor layer 161 and may include, for example, Au, Ag, Cu, Ni, Pt, Pd, Al, Mo, or a combination thereof.

An interlayer insulating layer 114 may be formed on the gate electrode 162. The interlayer insulating layer 114 may be formed of a single layer of silicon nitride ($SiN_x$) or silicon oxide ($SiO_2$) or a laminated layer of silicon nitride ($SiN_x$) and silicon oxide ($SiO_2$).

A source electrode 163 and a drain electrode 164 may be formed on the interlayer insulating layer 114. The source electrode 163 and the drain electrode 164 may be connected with the source region and the drain region of the semiconductor layer 161 through a via hole formed in the interlayer insulating layer 114 and the gate insulating layer 114, respectively. The source electrode 163 and the drain electrode 164 may be formed by a metal multilayer such as Mo/Al/Mo or Ti/Al/Ti.

In FIG. 4, a top gate type driving thin film transistor TFT is illustrated as an example. In an embodiment, a structure of the driving thin film transistor TFT may differ. The driving thin film transistor TFT may be covered by a planarization layer 115 and connected to the organic light emitting diode OLED to drive the organic light emitting diode OLED.

The planarization layer 115 may be formed of a single layer of an inorganic insulating material or an organic insulating material or a laminated layer of the inorganic insulating material and the organic insulating material. The inorganic insulating material may include, for example, $SiO_2$, SiNx, $Al_2O_3$, $TiO_2$, or $ZrO_2$, and the organic insulating material may include, for example, an acryl-based polymer, an imide-based polymer, or polystyrene.

A pixel electrode 171 may be formed on the planarization layer 115. The pixel electrode 171 may be formed one by one for each subpixel and connected with the drain electrode 164 of the driving thin film transistor TFT through the via hole formed in the planarization layer 115. A pixel defining layer 116 may be formed on the planarization layer 115 and an edge of the pixel electrode 171. The pixel defining layer 116 may include, for example, a polyacryl-based or polyimide-based resin and a silica-based inorganic material.

An emission layer 172 may be formed on the pixel electrode 171, and a common electrode 173 may be formed on the emission layer 172 and the pixel defining layer 116. The common electrode 173 may be formed over the display unit 130. One of the pixel electrode 171 and the common electrode 173 may inject a hole to the emission layer 172, and the other one may inject an electron to the emission layer 172.

The emission layer 172 may include an organic emission layer, and may include one or more of a hole injection layer, a hole transport layer, an electron transport layer, or an electron injection layer. An electron and a hole may be coupled with each other in the organic emission layer to generate an exciton, and light may be emitted by energy generated when the exciton falls from an excited state to a ground state.

The pixel electrode 171 may be formed by a metal reflective film, and the common electrode 173 may be formed by a transparent film or a translucent film. The light emitted from the emission layer 172 may be reflected from the pixel electrode 171 and may pass through the common electrode 173 to be emitted toward the second substrate 120.

The metal reflective film may include, for example, Au, Ag, Mg, Al, Pt, Pd, Ni, Nd, Ir, or Cr. The transparent film may include, for example, indium tin oxide (ITO), indium zinc oxide (IZO), zinc oxide (ZnO), or indium oxide ($In_2O_3$). The translucent film may be formed by a metal thin film including, for example, Li, Ca, LiF/Ca, LiF/Al, Al, Ag, or Mg, and a transparent film such as, for example, ITO, IZO, ZnO, or $In_2O_3$, may be formed on the translucent film.

Figure 5:
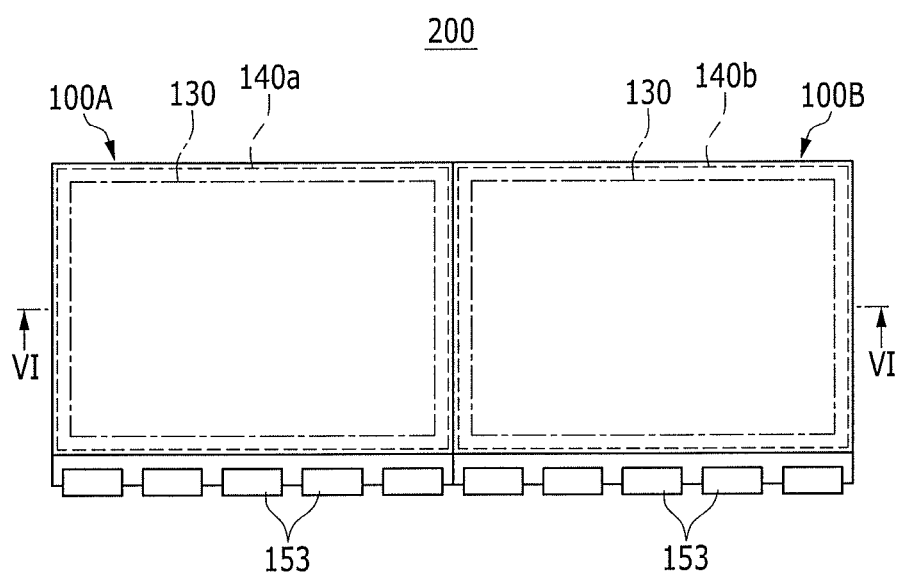
FIG. 5 illustrates a plan view of a display device according to a second exemplary embodiment.
Figure 6:
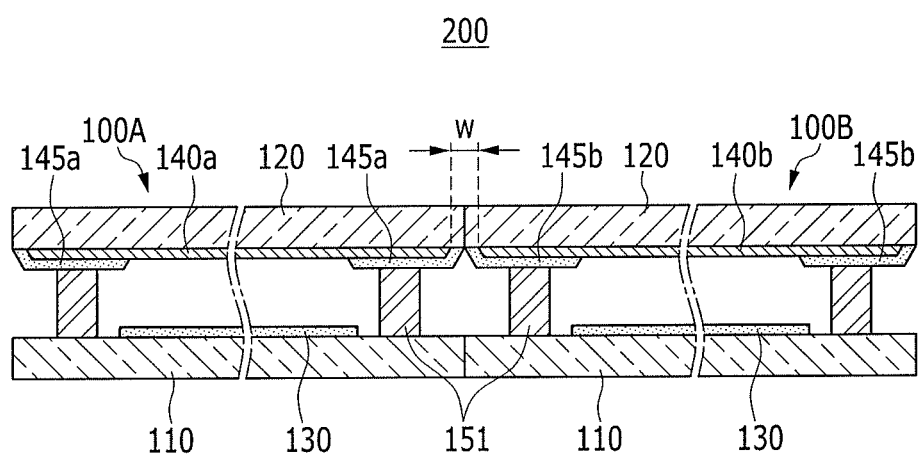
FIG. 6 illustrates a partial cross-sectional view of the display device of FIG. 5 taken along line VI-VI.

FIG. 5 illustrates a plan view of a display device according to a second exemplary embodiment, and FIG. 6 illustrates a partial cross-sectional view of the display device of FIG. 5 taken along line VI-VI.

Referring to FIGS. 5 and 6, a display device 200 according to the second exemplary embodiment may include at least two display panels 100A and 100B, the sides of which may contact each other. Illustrated as an example in FIG. 5, the short sides of the first display panel 100A and the second display panel 100B may contact each other. In an embodiment, long sides of the first and second display panels 100A and 100B may contact each other. In an embodiment, and the number of display panels 100A and 100B may differ from two.

The first display panel 100A and the second display panel 100B may be configured by the same configuration as the aforementioned display device of the first exemplary embodiment. In FIG. 5, the same reference numerals as the aforementioned first exemplary embodiment are applied to the constituent elements of the first and second display panels 100A and 100B, except for the reflective film and the passivation layer.

For convenience, the reflective film and the passivation layer of the first display panel 100A are referred to as a first reflective film 140a and a first passivation layer 145a, respectively, and the reflective film and the passivation layer of the second display panel 100B are referred to as a second reflective film 140b and a second passivation layer 145b, respectively.

The first reflective film 140a may be extended up to the outside of the sealant 151 of the first display panel 100A to be close to the edge of the second substrate 120. The second reflective film 140b may also be extended up to the outside of the sealant 151 of the second display panel 100B to be close to the edge of the second substrate 120.

The first passivation layer 145a may cover at least a portion outside the sealant 151 of the first reflective film 140a to prevent the first reflective film 140a from being exposed to external air. The second passivation layer 145b may also cover at least a portion outside the sealant 151 of the second reflective film 140b to prevent the second reflective film 140b from being exposed to external air.

At the side where the first display panel 100A and the second display panel 100B contact each other, the first passivation layer 145a and the second passivation layer 145b may contact each other.

The display device 200 of the second exemplary embodiment may implement a large screen by using the plurality of display panels 100A and 100B, the sides of which may contact each other, and may prevent a boundary line between the first display panel 100A and the second display panel 100B from being recognized by a user in the mirror mode by using the first and second reflective films 140a and 140b extended to the outside of the sealant 151.

Since the first and second reflective films 140a and 140b may be positioned with a very small distance w (see FIG. 6) at an attached portion of the first and second display panels 100A and 100B, it may be difficult for the user to recognize the boundary line between the first display panel 100A and the second display panel 100B in the mirror mode.

Figure 7:
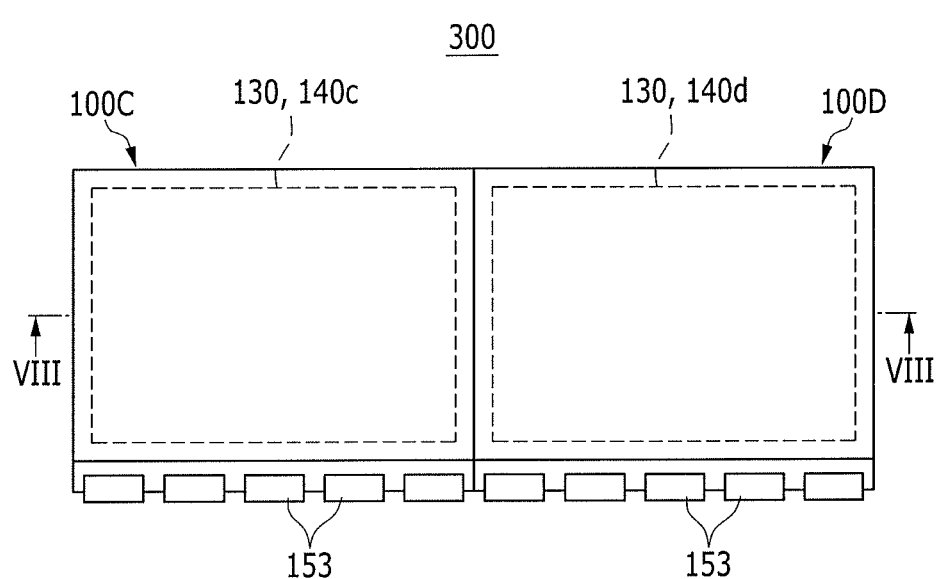
FIG. 7 illustrates a plan view of a display device of a Comparative Example.
Figure 8:
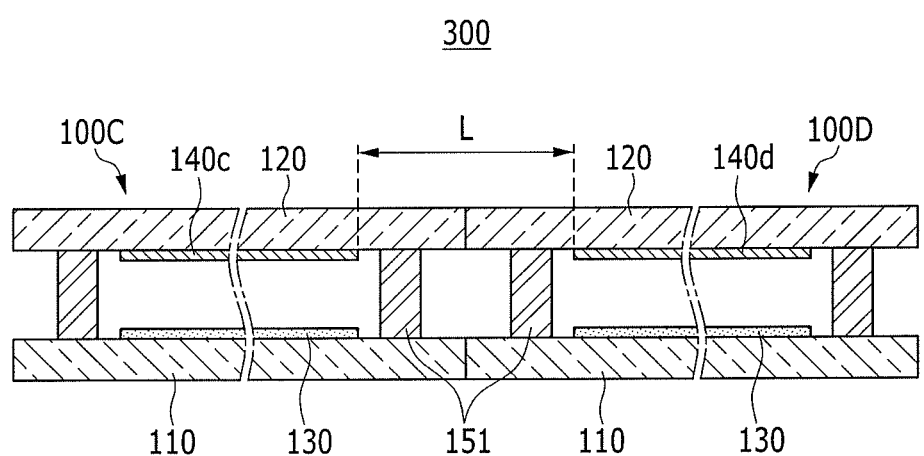
FIG. 8 illustrates a partial cross-sectional view of the display device of FIG. 7 taken along line VIII-VIII.

FIG. 7 illustrates a plan view of a display device of a Comparative Example, and FIG. 8 illustrates a partial cross-sectional view of the display device of FIG. 7 taken along line VIII-VIII.

Referring to FIGS. 7 and 8, in a display device 300 of the Comparative Example, a first reflective film 140c is positioned inside a sealant 151 of a first display panel 100C, and a second reflective film 140d is positioned inside a sealant 151 of a second display panel 100D. At an attached portion of the first and second display panels 100C and 100D, a distance L (see FIG. 8) between the first reflective film 140c and the second reflective film 140d may be larger than a value obtained by adding a width of the two sealants 151 to the distance between the two sealants 151.

A user observing the display device 300 in the Comparative Example may easily recognize a boundary line between the first display panel 100C and the second display panel 100D in the mirror mode. The recognition of the boundary line may reduce quality of the mirror mode and may act as a very disadvantageous characteristic in the display device implementing the large screen by attaching the plurality of display panels to each other.

By way of summation and review, a display device may implement a mirror function by using reflection of external light in addition to a display function. The display device may perform a display by pixel emission or may reflect external light by using a reflective film formed on a front surface when a display is not performed, thereby serving as a mirror. The described technology relates to a display device having a mirror function.

Provided is a display device that may be capable of implementing a high-quality large-sized display device by impeding recognition of a boundary line between display panels when the large-sized display device is manufactured by enhancing quality of a mirror function and reliability of products and combining a plurality of display panels.

In the display device of an exemplary embodiment, even though a reflective film may be extended up to the outside of a sealant, the reflective film may be covered by a passivation layer, and may not contact external air, and the reflective film may not function as a passage transferring moisture and oxygen into the display device. Therefore, in the display device, the reflective film may be extended to enhance quality of a mirror surface and suppress deterioration in the display unit in a mirror mode, and reliability of products may be enhanced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a first substrate and a second substrate facing each other and integrally attached to each other by a sealant;
   a display unit on one surface of the first substrate facing the second substrate;
   a reflective film on one surface of the second substrate facing the first substrate, the reflective film including a first region inside the sealant, a second region overlapping the sealant, and a third region outside the sealant; and
   a passivation layer covering at least the third region of the reflective film, wherein the passivation layer covers a part of an edge of the first region facing the sealant, an entirety of the second region, and an entirety of the third region of the reflective film.

2. The display device as claimed in claim 1, wherein:
   the display unit includes an emission area and a non-emission area, and
   the first region of the reflective film includes an opening corresponding to the emission area.

3. The display device as claimed in claim 2, wherein the emission area includes at least one subpixel.

4. The display device as claimed in claim 1, wherein:
the third region of the reflective film is spaced apart from an edge of the second substrate, and
the passivation layer contacts the edge of the second substrate.

5. The display device as claimed in claim 1, wherein:
the reflective film includes a metal, and
the passivation layer includes one or more of silicon nitride, silicon oxide, or polyimide.

6. A display device, comprising:
at least two display panels including sides that contact each other,
each of the at least two display panels including:
a first substrate and a second substrate facing each other and integrally attached to each other by a sealant;
a display unit on one surface of the first substrate facing the second substrate;
a reflective film on one surface of the second substrate facing the first substrate, the reflective film including a first region inside the sealant, a second region overlapping the sealant, and a third region outside the sealant; and a passivation layer covering at least the third region of the reflective film, wherein the passivation layer covers a part of an edge of the first region facing the sealant, an entirety of the second region, and an entirety of the third region of the reflective film.

7. The display device as claimed in claim 6, wherein:
the display unit includes an emission area and a non-emission area, and
the first region of the reflective film includes an opening corresponding to the emission area.

8. The display device as claimed in claim 7, wherein the emission area includes at least one subpixel.

9. The display device as claimed in claim 6, wherein:
the third region of the reflective film is spaced apart from an edge of the second substrate, and
the passivation layer contacts the edge of the second substrate.

10. The display device as claimed in claim 6, wherein:
the reflective film includes a metal, and
the passivation layer includes one or more of silicon nitride, silicon oxide, or polyimide.

* * * * *